(12) United States Patent
Wang

(10) Patent No.: US 12,396,259 B2
(45) Date of Patent: Aug. 19, 2025

(54) ARRAY SUBSTRATE, METHOD FOR MANUFACTURING ARRAY SUBSTRATE, AND DISPLAY PANEL

(71) Applicant: GUANGZHOU CHINA STAR OPTOELECTRONICS SEMICONDUCTOR DISPLAY TECHNOLOGY CO., LTD., Guangzhou (CN)

(72) Inventor: Hang Wang, Guangzhou (CN)

( * ) Notice: Subject to any disclaimer, the term of this patent is extended or adjusted under 35 U.S.C. 154(b) by 495 days.

(21) Appl. No.: 17/990,688

(22) Filed: Nov. 20, 2022

(65) Prior Publication Data

US 2024/0128271 A1    Apr. 18, 2024

(30) Foreign Application Priority Data

Oct. 14, 2022    (CN) .......................... 202211256574.6

(51) Int. Cl.
    *H10D 86/01*      (2025.01)
    *H10D 86/40*      (2025.01)

(52) U.S. Cl.
    CPC ....... *H10D 86/0231* (2025.01); *H10D 86/451* (2025.01)

(58) Field of Classification Search
    CPC .......................... H10D 86/0231; H10D 86/451
    See application file for complete search history.

(56) References Cited

U.S. PATENT DOCUMENTS

2016/0372489 A1    12/2016    Li et al.

FOREIGN PATENT DOCUMENTS

| CN | 1525533 A | 9/2004 |
| CN | 104538407 A | 4/2015 |
| CN | 106409874 A | * 2/2017 ......... H10K 59/1216 |

OTHER PUBLICATIONS

Chinese Office Action issued in corresponding Chinese Patent Application No. 202211256574.6 dated Nov. 22, 2022, pp. 1-9.

* cited by examiner

*Primary Examiner* — Peter M Albrecht

(57) ABSTRACT

Provided is a array substrate, a manufacturing method thereof, and a display panel. The array substrate comprises a laminated substrate, a first insulating layer, a second insulating layer, and a third insulating layer, wherein a horizontal etching rate of the second insulating layer is less than that of the first insulating layer and the third insulating layer. The array substrate comprises a first region provided with a first type of via holes and a second region provided with a second type of via holes, the first type of via holes penetrates through the first, second and third insulating layers, and the second type of via holes penetrates through the third insulating layer. In the present disclosure, undercut structures formed in the first type of via holes can be eliminated through two etching processes, thus avoiding over-etching of the second type of via holes.

20 Claims, 6 Drawing Sheets

ARRAY SUBSTRATE, METHOD FOR MANUFACTURING ARRAY SUBSTRATE, AND DISPLAY PANEL

CROSS-REFERENCE TO RELATED APPLICATION

The present disclosure claims priority to and the benefit of Chinese Patent Application No. 202211256574.6, filed on Oct. 14, 2022, the entire content of which is hereby incorporated by reference.

TECHNICAL FIELD

The present disclosure relates to a technical field of display, and in particular, to an array substrate, a method for manufacturing an array substrate and a display panel.

BACKGROUND

In the structure of an existing thin film transistor, a plurality of layers of insulating materials are usually provided to insulate metal materials of different layers. Due to the existence of line-changing between different metal layers, it is necessary to etch the plurality of layers of insulating materials to form line-changing holes. Since there are deep line-changing holes and shallow line-changing holes in different regions, and in order to reduce the etching process, the deep line-changing holes and shallow line-changing holes are usually etched simultaneously. However, different etching rates of the different insulating materials result in technical problems such as undercut structures or over-etching of the line-changing holes or electrically connected via holes occur.

SUMMARY

The present disclosure provides an array substrate, a method for manufacturing an array substrate and a display panel to solve the technical problems that undercut structures or over-etching of the line-changing holes or electrically connected via holes occur in a current array substrate.

To solve the above problems, technical solutions provided in the present disclosure are as follows:

The present disclosure provides an array substrate, which comprises:
 a substrate;
 a first insulating layer disposed on the substrate;
 a second insulating layer disposed on the first insulating layer, a horizontal etching rate of the first insulating layer being greater than a horizontal etching rate of the second insulating layer; and
 a third insulating layer disposed on the second insulating layer, a horizontal etching rate of the third insulating layer being greater than a horizontal etching rate of the second insulating layer;
 wherein the array substrate is provided with a first region and a second region, and the array substrate comprises a first type of via holes and a second type of via holes, wherein the first type of via holes are disposed in the first region, the second type of via holes are disposed in the second region, the first type of via holes penetrate through the first insulating layer, the second insulating layer, and the third insulating layer, the second type of via holes penetrate through the third insulating layer, a hole depth of the first type of via holes is greater than that of the second type of via holes, and a pore diameter of the first type of via holes is greater than that of the second type of via holes.

In the array substrate of the present disclosure, the first type of via holes comprise a first via hole penetrating through the first insulating layer, the second insulating layer, and a third insulating layer; and
 the second type of via holes comprise a second via hole and a third via hole, wherein the third via hole penetrates through the third insulating layer, and the second via hole penetrates through the second insulating layer and the third insulating layer;
 wherein a hole depth of the first via hole is greater than that of the second via hole, a hole depth of the second via hole is greater than that of the third via hole, a pore diameter of the first via hole is greater than that of the third via hole, and a pore diameter of the third via hole is greater than that of the second via hole.

In the array substrate of the present disclosure, the second via hole comprises a first via hole wall disposed on the third insulating layer and a second via hole wall disposed on the second insulating layer, and the first via hole wall and the second via hole wall are continuously disposed; or
 the first via hole wall and the second via hole are discontinuously disposed, and a pore diameter of the second via hole on the third insulating layer is larger than that of the second via hole on the second insulating layer.

In the array substrate of the present disclosure, via hole walls of the first via hole on the third insulating layer, the second insulating layer, and the first insulating layer are continuously disposed;
 wherein an inclination angle of the via hole walls in the first via hole is smaller than that of the via hole walls in the second via hole.

In the array substrate of the present disclosure, the via hole wall of the first via hole on the second insulating layer and the via hole wall on the first insulating layer are continuously disposed, and the via hole wall of the first via hole on the third insulating layer and the via hole wall on the second insulating layer are discontinuously disposed;
 wherein a pore diameter of the first via hole on the third insulating layer is greater than pore diameters of the first via hole on the second insulating layer and the first insulating layer.

In the array substrate of the present disclosure, the array substrate comprises a gate layer disposed on the substrate, a gate insulating layer disposed on the gate layer, a source-drain layer disposed on the gate insulating layer, a first passivation layer disposed on the source-drain layer, a common electrode layer disposed on the first passivation layer, a second passivation layer disposed on the common electrode layer, and a pixel electrode layer disposed on the second passivation layer; and
 wherein the first via hole penetrates through the second passivation layer, the first passivation layer and the gate insulating layer for electrically connecting the common electrode layer and the gate layer, the second via hole penetrates through the second passivation layer and the first passivation layer for electrically connecting the source-drain layer and the pixel electrode layer, and the third via hole penetrates through the second passivation layer for electrically connecting the common electrode layer and a portion of the pixel electrode layer.

The present disclosure further provides a method for manufacturing an array substrate, comprising steps of:

sequentially forming a first insulating layer, a second insulating layer, a third insulating layer, and a photoresist layer on a substrate, wherein a horizontal etching rate of the first insulating layer is greater than a horizontal etching rate of the second insulating layer, and a horizontal etching rate of the third insulating layer is greater than a horizontal etching rate of the second insulating layer;

performing a first patterning process on the photoresist layer to form a first photoresist pattern, and performing a first etching process on the first insulating layer, the second insulating layer, and the third insulating layer in a first region of the array substrate through the first photoresist pattern;

performing a second patterning process on the first photoresist pattern to form a second photoresist pattern, and performing a second etching process on the first insulating layer, the second insulating layer and the third insulating layer in the first region of the array substrate through the second photoresist pattern to form a first type of via holes, and performing a first etching process on the third insulating layer and/or the second insulating layer in a second region of the array substrate to form a second type of via holes;

wherein a hole depth of the first type of via holes is greater than that of the second type of via holes, and a pore diameter of the first type of via holes is greater than that of the second type of via holes.

In the method for manufacturing an array substrate of the present disclosure, the step of performing a first patterning process on the photoresist layer to form a first photoresist pattern, and performing a first etching process on the first insulating layer, the second insulating layer, and the third insulating layer in a first region of the array substrate through the first photoresist pattern comprises:

performing a first patterning process on the photoresist layer to form a first photoresist pattern, the first photoresist pattern comprises a first photoresist portion, a second photoresist portion, a third photoresist portion, and a fourth photoresist portion, thicknesses of the first photoresist portion, the second photoresist portion, and the third photoresist portion being the same, the thicknesses of the first photoresist portion, the second photoresist portion, and the third photoresist portion being less than a thickness of the fourth photoresist portion, and the first photoresist portion comprising a first through hole located in the first region; and performing a first etching process on the first insulating layer, the second insulating layer, and the third insulating layer exposed through the first via hole.

In the method for manufacturing an array substrate of the present disclosure, the step of performing a second patterning process on the first photoresist pattern to form a second photoresist pattern, and performing a second etching process on the first insulating layer, the second insulating layer and the third insulating layer in the first region of the array substrate through the second photoresist pattern, and performing a first etching process on the third insulating layer in a second region of the array substrate comprises:

processing the first photoresist pattern by an ashing process to remove the first photoresist portion, the second photoresist portion, and the third photoresist portion; and performing a second etching process on the first insulating layer, the second insulating layer and the third insulating layer corresponding to the first photoresist to form a first via hole, performing a first etching process on the second insulating layer and the third insulating layer corresponding to the second photoresist portion to form a second via hole, and performing a first etching process on the third insulating layer corresponding to the third photoresist portion to form a third via hole;

wherein a hole depth of the first via hole is greater than that of the second via hole, a hole depth of the second via hole is greater than that of the third via hole, a pore diameter of the first via hole is greater than that of the third via hole, and a pore diameter of the third via hole is greater than that of the second via hole.

The present disclosure further provides a display panel comprising the above mentioned array substrate.

Beneficial effects: according to the present disclosure, in the first etching process, initially etching is performed on the first type of via holes, and in the second etching process, etching is performed simultaneously on the first type of via holes and the second type of via holes, so that undercut structures formed in the first type of via holes caused by the second insulating layer with a low etching rate are eliminated, meanwhile the second type of via holes are subjected to etching for only one time, thus avoiding the technical problem of over-etching of the second type of via holes.

BRIEF DESCRIPTION OF THE DRAWINGS

The technical solutions and other beneficial effects of the present disclosure will be apparent from the detailed description of specific embodiments of the present disclosure with reference to the accompanying drawings.

DETAILED DESCRIPTION

Figure 1:
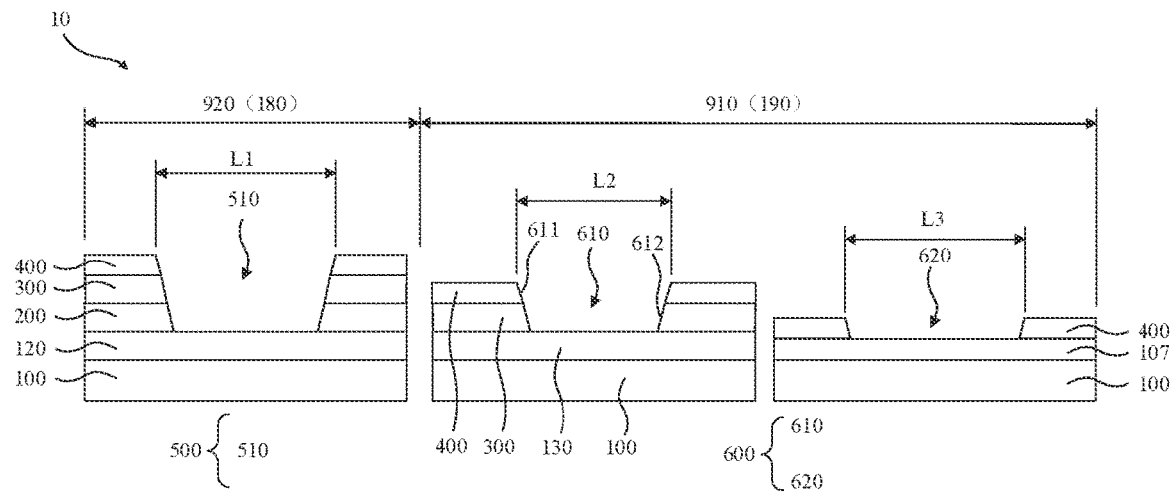
FIG. 1 is a first schematic structural diagram of an array substrate according to the present disclosure.

Hereinafter, technical solutions in embodiments of the present disclosure will be clearly and completely described with reference to the accompanying drawings in embodiments of the present disclosure. Apparently, the described embodiments are part of, but not all of, the embodiments of the present disclosure. All other embodiments, obtained by a person with ordinary skill in the art on the basis of the embodiments in the present disclosure without expenditure of creative labor, belong to the protection scope of the present disclosure.

Referring to FIGS. 1 to 6, the present disclosure provides an array substrate 10, which comprises a substrate 100, a first insulating layer 200 disposed on the substrate 100, a second insulating layer 300 disposed on the first insulating layer 200, and a third insulating layer 400 disposed on the second insulating layer 300.

In this embodiment, a horizontal etching rate of the first insulating layer 200 is greater than a horizontal etching rate of the second insulating layer 300, and a horizontal etching rate of the third insulating layer 400 is greater than a horizontal etching rate of the second insulating layer 300.

In this embodiment, the array substrate 10 is provided with a first region 180 and a second region 190. The array substrate 10 comprises a first type of via holes 500 and a second type of via holes 600, wherein the first type of via holes 500 are disposed in the first region 180, the second type of via holes 600 are disposed in the second region 190, the first type of via holes 500 penetrate through the first insulating layer 200, the second insulating layer 300, and the third insulating layer 400, the second type of via holes 600 penetrate through the third insulating layer 400, a hole depth of the first type of via holes 500 is greater than that of the second type of via holes 600, and a pore diameter of the first type of via holes 500 is greater than that of the second type of via holes 600.

According to the present disclosure, in the first etching process, initially etching is performed on the first type of via holes 500, and in the second etching process, etching is performed simultaneously on the first type of via holes 500 and the second type of via holes 600, so that undercut structures formed in the first type of via holes 500 caused by the second insulating layer 300 with a low etching rate are eliminated, meanwhile the second type of via holes 600 are subjected to etching for only one time, thus avoiding the technical problem of over-etching of the second type of via holes 600. Meanwhile, since the first type of via holes 500 penetrate through three insulating layers, when depths of the via holes electrically connected to each other are large, if pore diameters of an opening is small, contact impedance between an upper layer metal and the first metal layer 120 may be increased, and a technical problem of poor contact may occur. In the present disclosure, pore diameters of the first type of via holes 500 are increased, so that contact areas between the upper layer metal and the first metal layer 120 can be increased, and contact impedance between an upper layer metal and the first metal layer 120 can be reduced, thus improving the technical problem of poor contact between the upper layer metal and the first metal layer 120.

Technical solutions of the present disclosure will now be described with reference to specific embodiments.

Figure 2:
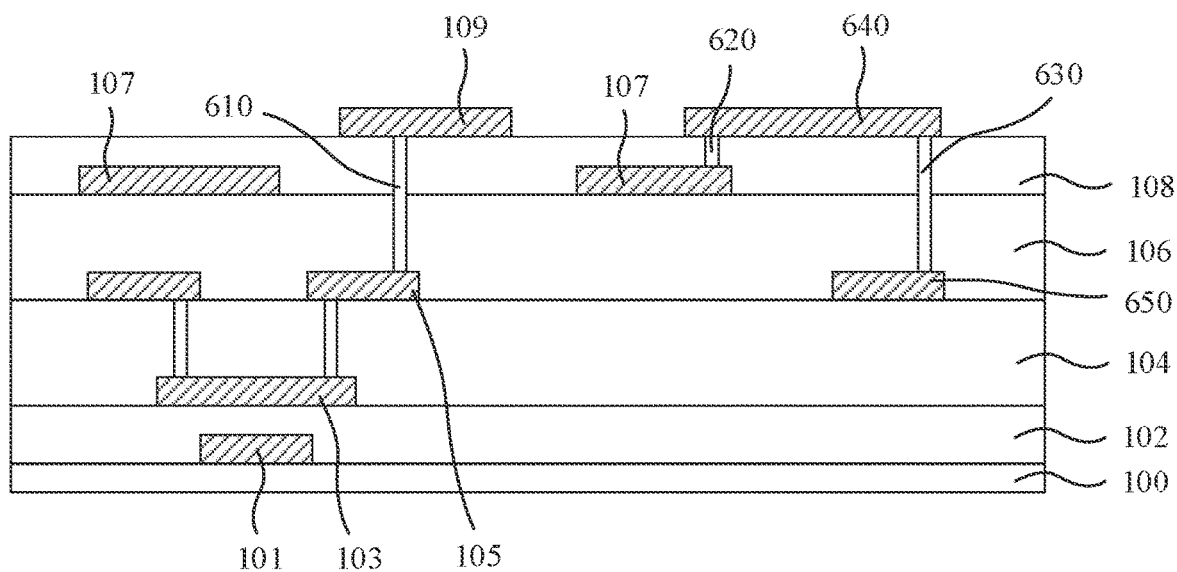
FIG. 2 is a schematic structural diagram of a thin film transistor region in an array substrate according to the present disclosure.

Referring to FIGS. 1-2, the array substrate 10 may comprise a substrate 100 and a thin film transistor layer disposed on the substrate 100, and the thin film transistor layer may comprise a plurality of metal layers and a plurality of insulating layers.

In this embodiment, material of the substrate 100 may be a material such as glass, quartz, or polyimide, or a flexible material such as polyimide, or a laminated film layer of a flexible material and an inorganic material.

In this embodiment, referring to FIG. 2, the thin film transistor layer may comprise a plurality of thin film transistors, which may be of an etch-blocking type, a back-channel etching type, or a structure that is divided into a bottom-gate thin film transistor, a top-gate thin film transistor, etc. according to positions of the gate and the active layer 103, but there is no specific limitation. For example, the thin film transistor shown in FIG. 2 is a bottom-gate type thin film transistor, which may comprise a gate layer 101 disposed on the substrate 100, a gate insulating layer 102 disposed on the gate layer 101, an active layer 103 disposed on the gate insulating layer 102, an interlayer insulating layer 104 disposed on the active layer 103, a source-drain layer 105 disposed on the interlayer insulating layer 104, a first passivation layer 106 disposed on the source-drain layer 105, and a common electrode layer 107 disposed on the first passivation layer 106, a second passivation layer 108 disposed on the common electrode layer 107, and a pixel electrode layer 109 disposed on the second passivation layer 108, wherein the common electrode layer 107 layer is connected with a constant voltage source, the pixel electrode layer 109 is electrically connected with the source-drain, and an electric field generated by the common electrode layer 107 and the pixel electrode layer 109 drives a liquid crystal to deflect.

In this embodiment, the gate layer 101 may be the first metal layer 120 of the array substrate 10 of the present disclosure, and the source-drain layer 105 may be the second metal layer 130 of the array substrate 10 of the present disclosure. The bottom-gate type thin film transistor in this embodiment comprises the interlayer insulating layer 104. In other embodiments, the interlayer insulating layer 104 may not be provided, but the source-drain layer 105 and the active layer 103 are directly connected in contact.

In this embodiment, the first insulating layer 200 may comprise the gate insulating layer 102, the second insulating layer 300 may comprise the first passivation layer 106, and the third insulating layer 400 may comprise the second passivation layer 108.

In this embodiment, due to the existence of line-changing between different metal layers or electrical connection between different metal layers in the existing array substrate 10, it is necessary to etch an intermediate insulating layer to electrically connect the different metal layers.

In the array substrate 10 of the present disclosure, referring to FIG. 1, the first type of via holes 500 may comprise a first via hole 510 penetrating through the first insulating layer 200, the second insulating layer 300, and the third insulating layer 400. The second type of via holes 600 comprise a second via hole 610 and a third via hole 620, wherein the third via hole 620 penetrates through the third insulating layer 400, and the second via hole 610 penetrates through the second insulating layer 300 and the third insulating layer 400.

In this embodiment, a hole depth of the first via hole 510 is greater than that of the second via hole 610, a hole depth of the second via hole 610 is greater than that of the third via hole 620, a pore diameter L1 of the first via hole 510 is greater than a pore diameter L3 of the third via hole 620, and a pore diameter L3 of the third via hole 620 is greater than a pore diameter L2 of the second via hole 610.

In this embodiment, the first metal layer 120 may be in contact with the first insulating layer 200, the first via hole 510 may correspond to the first metal layer 120, and the first via hole 510 exposes a portion of the first metal layer 120, so that an upper metal layer can be electrically connected with the first metal layer 120 through the first via hole 510. The second metal layer 130 may be in contact with the second insulating layer 300, the second via hole 610 corresponds to the second metal layer 130, and the second via hole 610 exposes a portion of the second metal layer 130, so that the upper metal layer can be electrically connected with the second metal layer 130 through the second via hole 610. The common electrode layer 107 may be in contact with the third insulating layer 400, the third via hole 620 corresponds to the common electrode layer 107, and the third via hole 620 exposes a portion of the common electrode layer 107, so that an upper metal layer can be electrically connected with the common electrode layer 107 through the third via hole 620.

Figure 3:
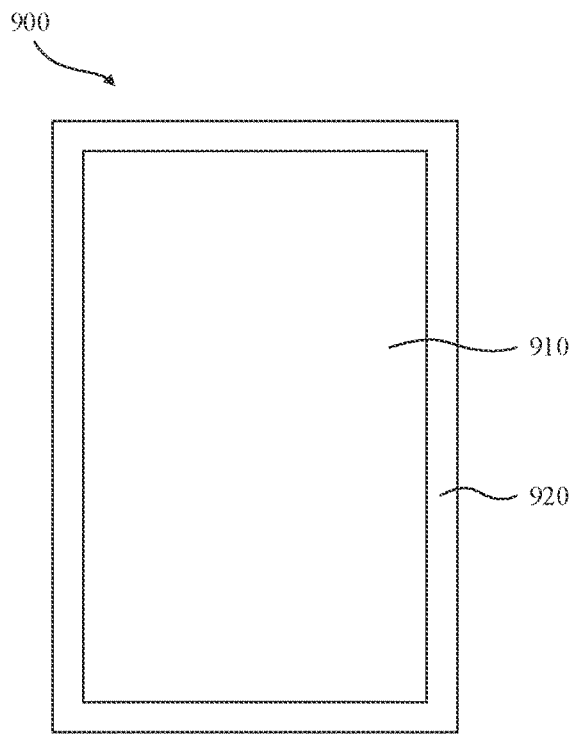
FIG. 3 is a schematic structural diagram of a display panel according to the present disclosure.

In this embodiment, referring to FIG. 3, which is a schematic structural diagram of a display panel 900 according to the present disclosure. The display panel 900 comprises a display area 910 within which the first area 180 may be located and a non-display area 920 within which the second area 190 may be located. Alternatively, the first area 180 and the second area 190 may be simultaneously located within the display area 910 or the non-display area 920. In the following embodiments of the present disclosure, it is illustrated by taking the first area 180 in the non-display area 920, and the second area 190 in the display area 910 as an example.

Referring to FIG. 3, the first via hole 510 may be disposed in the non-display area 920, and the second via hole 610 and the third via hole 620 may be disposed in the display area 910. For example, the first via hole 510 may be a peripheral line-changing hole in the array substrate 10 of the display panel 900, so that a metal line provided in the same layer as the gate layer 101 is changed to the second passivation layer 108. Since the first via hole 510 is located in the non-display area 920, and the interlayer insulating layer 104 may be formed into a film only in the display area 910, there are only three insulating film layers between the peripheral gate layer 101 and the common electrode layer 107. The second via hole 610 may be a connection hole in the display area 910, for example, the source-drain is electrically connected with the upper pixel electrode layer 109 through the second via hole 610.

In this embodiment, the third via hole 620 may be a connection hole in the display area 910, and the common electrode layer 107 is connected with a constant voltage source, and a signal line of the constant voltage source is generally provided in the same layer as the gate layer 101 or the source-drain layer 105. Therefore, if it is necessary to introduce a signal of the constant voltage source to the common electrode layer 107, a mask process needs to be added to form a via hole on the first passivation layer 106, so that the source-drain layer 105 and the common electrode layer 107 are electrically connected. Referring to FIG. 2, in the present disclosure, a first transfer pad 640 may be formed on a second passivation layer 108, the first transfer pad 640 and the pixel electrode layer 109 may be formed in one mask process, the common electrode layer 107 is electrically connected with the first transfer pad 640 through a third via hole 620, and the first transfer pad 640 is electrically connected with the second transfer pad 650 through a transfer hole 630, and the second transfer pad 650 and the source-drain may be formed in one mask process. Since both the transfer hole 630 and the second via hole 610 penetrate through the first passivation layer 106 and the second passivation layer 108, the transfer hole 630 and the second via hole 610 may be formed in the same etching process, without adding an additional mask process, that is, a constant voltage source can be transmitted to the common electrode layer through the second transfer pad 650, the transfer hole 630, the first transfer pad 640 and the third via hole 620.

In this embodiment, referring to FIG. 1, since the first via hole 510 needs to be initially etched before the second via hole 610 and the third via hole 620 are etched, then the first via hole 510 is subjected to a second etching process together with the second via hole 610 and the third via hole 620, therefore, the first via hole 510 is subjected to two etching processes, such that the pore diameter L1 of the first via hole 510 is greater than the pore diameters of the second via hole 610 and the third via hole 620. In addition, the second via hole 610 and the third via hole 620 need to be subjected to only one etching process, further, since two layers of insulating layer are etched when the second via hole 610 is subjected to the etching process, and one layer of insulating layer is etched when the third via hole 620 is subjected to the etching process, therefore, the pore diameter L3 of the third via hole 620 is greater than the pore diameter L2 of the second via hole 610 under the same etching time.

In this embodiment, since the first via hole 510 penetrates through three insulating layers, when depth of the electrically connected via hole is large, if pore diameter of the opening is small, the contact impedance of an upper layer metal and the first metal layer 120 may be increased, and a technical problem of poor contact may occur. In the present disclosure, the pore diameter L1 of the first via hole 510 is increased, which increases contact area between the upper layer metal and the first metal layer 120, and reduces contact impedance therebetween, meanwhile, the technical problem of poor contact between the upper layer metal and the first metal layer 120 can be improved.

In the array substrate 10 of the present disclosure, referring to FIG. 1, the second via hole 610 comprises a first via hole wall 611 disposed on the third insulating layer 400 and a second via hole wall 612 disposed on the second insulating layer 300, and the first via hole wall 611 and the second via hole wall 612 are continuously disposed.

In this embodiment, since the second via hole 610 penetrates through the third insulating layer 400 and the second insulating layer 300, and a horizontal etching rate of the second insulating layer 300 is less than a horizontal etching rate of the third insulating layer 400, a step will appear between the third insulating layer 400 and the second insulating layer 300 when the second via hole 610 is etched, which will cause reduction of an exposed area of the second metal layer 130 corresponding to the second via hole 610, so as to reduce contact area between an upper layer metal and the second metal layer 130 and increase contact impedance between the upper layer metal and the second metal layer 130. Therefore, in the present disclosure, excessive material of the second insulating layer 300 in the second via hole 610 can be removed by increasing etching time, so that via hole wall of the second via hole 610 on the third insulating layer 400 and via hole wall on the second insulating layer 300 are discontinuously disposed.

In the array substrate 10 of the present disclosure, referring to FIG. 1, via hole walls of the first via hole 510 on the third insulating layer 400, the second insulating layer 300, and the first insulating layer 200 are continuously disposed, and an inclination angle of the via hole walls in the first via hole 510 is smaller than that of the via hole walls in the second via hole 610.

In this embodiment, the via hole walls of the first via hole 510 and the second via hole 610 are continuously disposed. However, since depth of the first via hole 510 is greater than that of the second via hole 610, the via hole with a larger depth has a larger contact impedance, and a problem of line breakage is prone to occur on the via hole walls. In the present disclosure, by increasing the inclination angle of the first via hole 510, slope of the via hole wall of the first via hole 510 is slower, which increases deposition area of the upper metal layer on the via hole wall of the first via hole 510, and reduces risk of line breakage of the upper metal layer on the via hole wall of the first via hole 510, and meanwhile reduces the contact impedance of the upper metal layer and the first metal layer 120.

Figure 4:
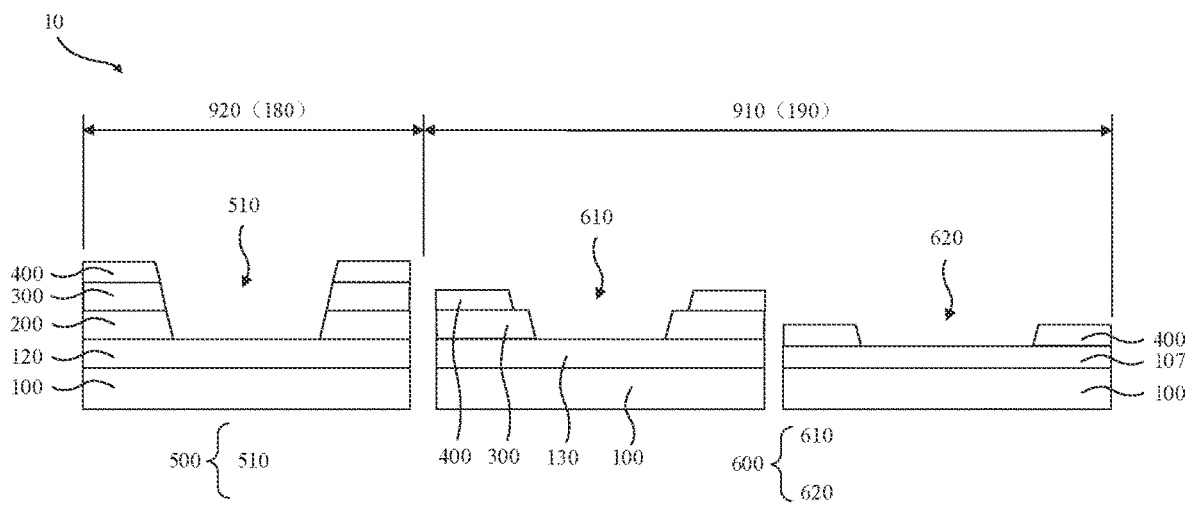
FIG. 4 is a second schematic structural diagram of an array substrate according to the present disclosure.
Figure 5:
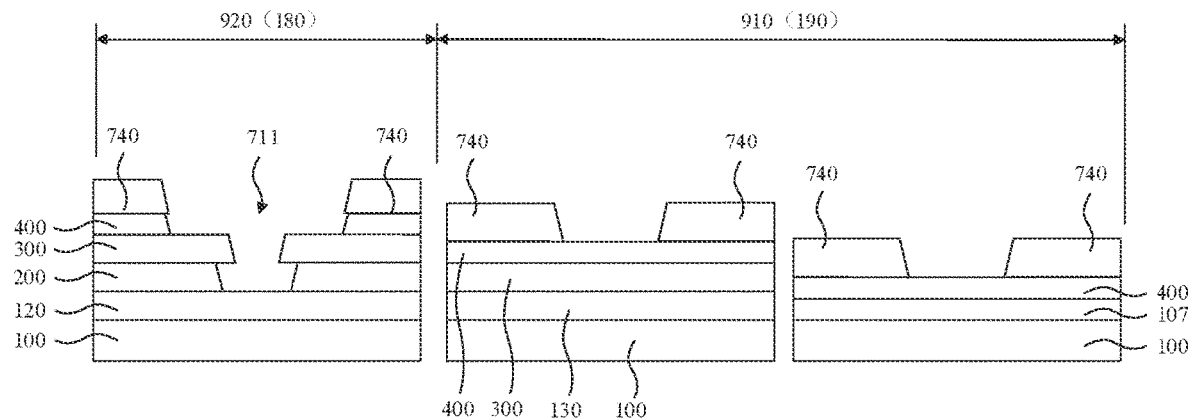
FIG. 5 is a schematic structural diagram of an array substrate during an intermediate step according to the present disclosure.

In the array substrate 10 of the present disclosure, referring to FIG. 4, the via hole wall of the second via hole 620 on the third insulating layer 400 and the via hole wall on the second insulating layer 300 are discontinuously disposed, and a pore diameter of the second via hole 610 on the third insulating layer 400 is greater than that of the second via hole 610 on the second insulating layer 300.

In this embodiment, since the horizontal etching rate of the third insulating layer 400 is greater than the horizontal etching rate of the second insulating layer 300, a step will appear between the third insulating layer 400 and the second insulating layer 300 when the second via hole 610 is etched. If the step needs to be removed, a longer etching time will be required, and may lead to over-etching of the third via hole 620. Therefore, etching of the second via hole 610 can be stopped according to whether there is an undercut structure in the first via hole 510. In addition, in the second via hole 610, via hole walls may have a large inclination angle, and occurrence of the step structure in the second via hole 610 may reduce risk of line breakage of the upper layer metal in the second via hole 610.

Figure 6:
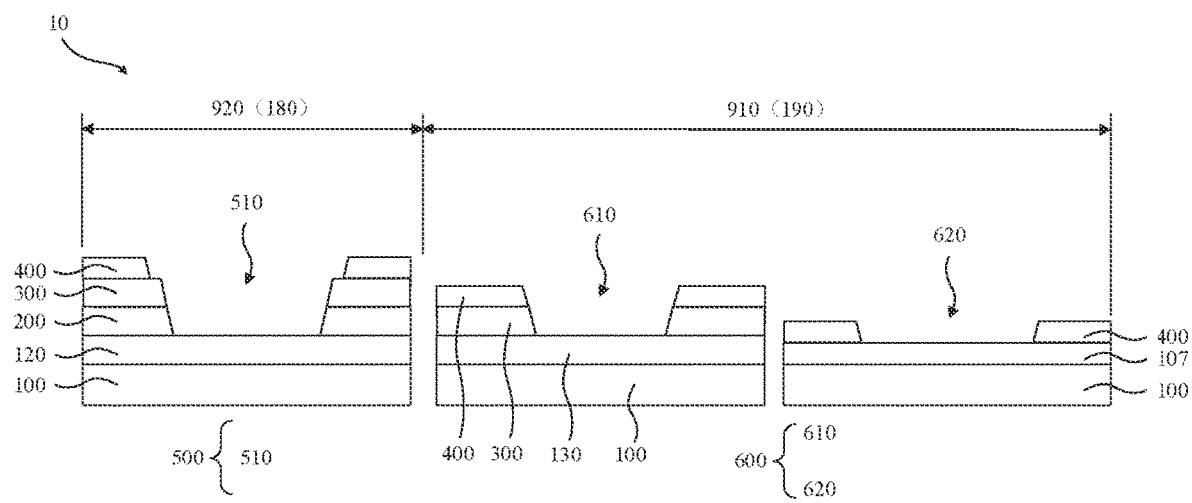
FIG. 6 is a third schematic structural diagram of an array substrate according to the present disclosure.

In the array substrate 10 of the present disclosure, referring to FIG. 6, the via hole wall of the first via hole 510 on the second insulating layer 300 and the via hole wall on the first insulating layer 200 are continuously disposed, and the via hole wall of the first via hole on the third insulating layer 400 and the via hole wall on the second insulating layer 300 are discontinuously disposed.

In this embodiment, a pore diameter of the first via hole 510 on the third insulating layer 400 is greater than pore diameters of the first via hole 510 on the second insulating layer 300 and the first insulating layer 200.

In this embodiment, since the first via hole 510 penetrates through the third insulating layer 400, the second insulating layer 300, and the first insulating layer 200, and the horizontal etching rate of the second insulating layer 300 is less than the horizontal etching rate of the third insulating layer 400 and the first insulating layer 200, a step will appear between the third insulating layer 400 and the second insulating layer 300 when the first via hole 510 is etched. Specifically, referring to the structure in FIG. 5, an undercut structure is formed between the first insulating layer 200 and the second insulating layer 300. Further, because the etching rate in the vertical direction of dry etching is greater than that in the horizontal direction, etching time of the first via hole 510 can be increased, that is, the undercut structure in FIG. 5 can be eliminated when the first via hole 510 is subjected to the second etching, so that structure of the first via hole 510 forms the structure as shown in FIG. 6.

In this embodiment, due to greater depth of the first via hole 510, risk of line breakage is easy to occur when the upper layer metal is deposited in the first via hole 510. However, in the present disclosure, a step structure is formed in the first via hole 510, which increases deposition area of the upper metal on the via hole wall of the first via hole 510, and reduces the risk of line breakage of the upper metal in the first via hole 510.

In the array substrate 10 of the present disclosure, materials of the first insulating layer 200 and the third insulating layer 400 are the same, and the materials of the first insulating layer 200 and the third insulating layer 400 may comprise silicon oxide and materials of the second insulating layer 300 may comprise silicon nitride.

In this embodiment, materials of the common electrode layer 107 and the pixel electrode layer 109 may comprise a transparent conductive material such as indium tin oxide.

Figure 7:
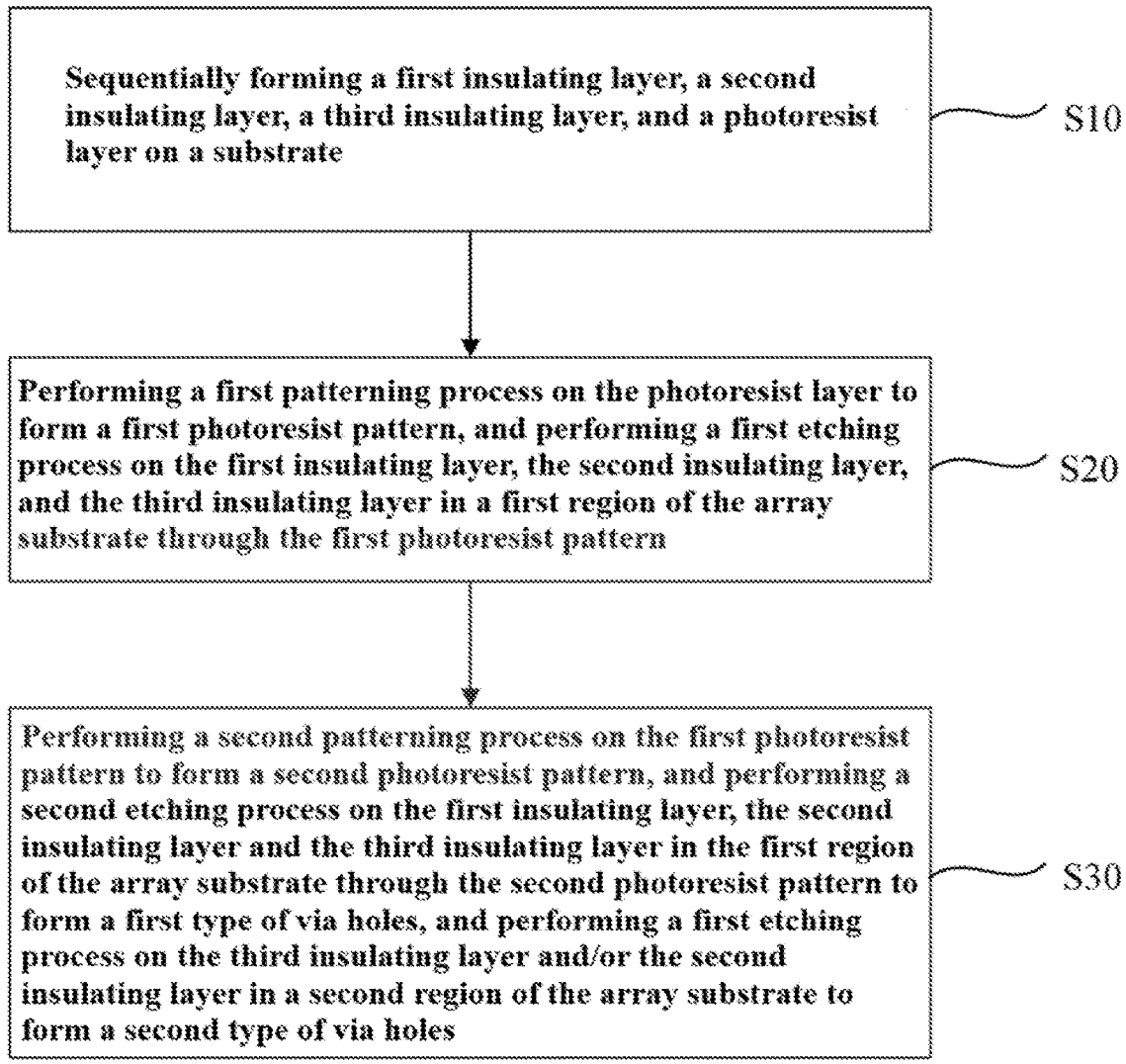
FIG. 7 is a process flow diagram of a method for manufacturing an array substrate according to the present disclosure.

Referring to FIG. 7, the present disclosure provides a method for manufacturing the array substrate 10, comprising steps of:

S10, sequentially forming the first insulating layer 200, the second insulating layer 300, the third insulating layer 400, and a photoresist layer 700 on the substrate 100, wherein a horizontal etching rate of the first insulating layer 200 is greater than a horizontal etching rate of the second insulating layer 300, and a horizontal etching rate of the third insulating layer 400 is greater than a horizontal etching rate of the second insulating layer 300.

In this step, material of the substrate 100 may be a material such as glass, quartz, or polyimide, or a flexible material such as polyimide, or a laminated film layer of a flexible material and an inorganic material.

Figure 8A:
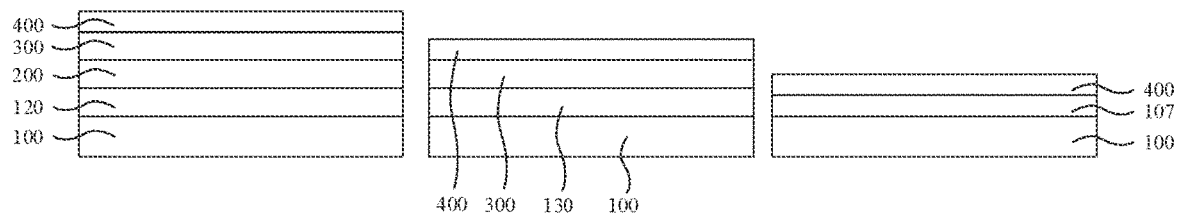
FIGS. 8a to 8e are process steps of a method for manufacturing an array substrate according to the present disclosure.

Referring to FIG. 8a, materials of the first insulating layer 200 and the third insulating layer 400 are the same, and the materials of the first insulating layer 200 and the third insulating layer 400 may comprise silicon oxide and materials of the second insulating layer 300 may comprise silicon nitride.

S20, performing a first patterning process on the photoresist layer 700 to form a first photoresist pattern, and performing a first etching process on the first insulating layer 200, the second insulating layer 300, and the third insulating layer 400 in a first region 180 of the array substrate 10 through the first photoresist pattern.

In this embodiment, step S20 may comprise:

S201, performing a first patterning process on the photoresist layer 700 to form a first photoresist pattern, the first photoresist pattern comprises a first photoresist portion 710, a second photoresist portion 720, a third photoresist portion 730, and a fourth photoresist portion 740, thicknesses of the first photoresist portion 710, the second photoresist portion 720, and the third photoresist portion 730 are the same, thicknesses of the first photoresist portion 710, the second photoresist portion 720, and the third photoresist portion 730 are less than a thickness of the fourth photoresist portion 740, and the first photoresist portion 710 comprises a first through hole 711 located in the first region 180.

S202, performing a first etching process on the first insulating layer 200, the second insulating layer 300, and the third insulating layer 400 exposed through the first through hole 711.

Figure 8B:
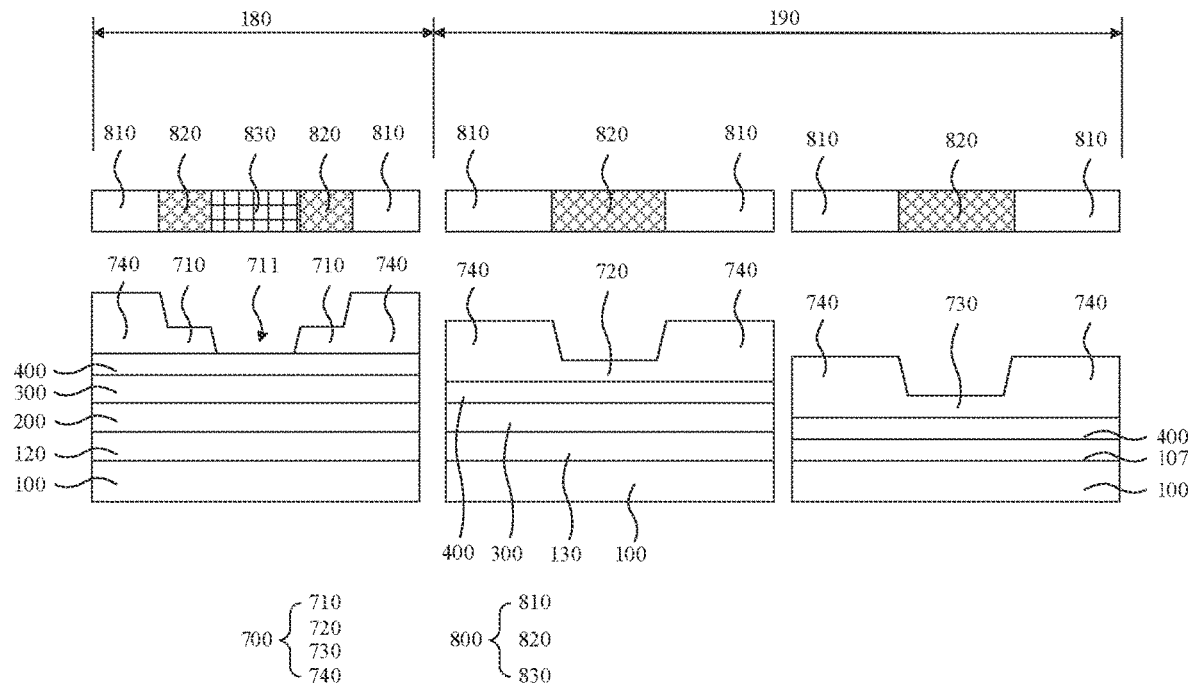

In this embodiment, referring to FIG. 8b, the first photoresist 710 is located in the first region 180 of the array substrate 10, which may be a peripheral line-changing region of the array substrate 10, corresponding to a non-display area 920 of the display panel 900. The second photoresist portion 720 and the third photoresist portion 730 may be located in the second region 190 of the array substrate 10, the second region 190 is an in-plane region of the array substrate 10, and the second region 190 corresponds to the display area 910 of the display panel 900.

In the step S201, referring to FIG. 8b, a multi-stage mask plate 800 is used to pattern the photoresist layer 700 to form the first photoresist portion 710, the second photoresist portion 720, the third photoresist portion 730, and the fourth photoresist portion 740 with different thicknesses. The multi-stage mask plate 800 may comprise a first light-transmitting region 810, a second light-transmitting region 820, and a third light-transmitting region 830, the first light-transmitting region 810 corresponds to the fourth photoresist portion 740, the third light-transmitting region 830 corresponds to the first through hole 711, and the second light-transmitting region 820 corresponds to the remaining regions.

In this embodiment, a positive photoresist is taken as an example of the material of the photoresist layer 700. The first light-transmitting region 810 may have a light transmittance of 0%, the second light-transmitting region 820 may have a light transmittance of 50%, and the third light-transmitting region 830 may have a light transmittance of 100%.

Figure 8C:
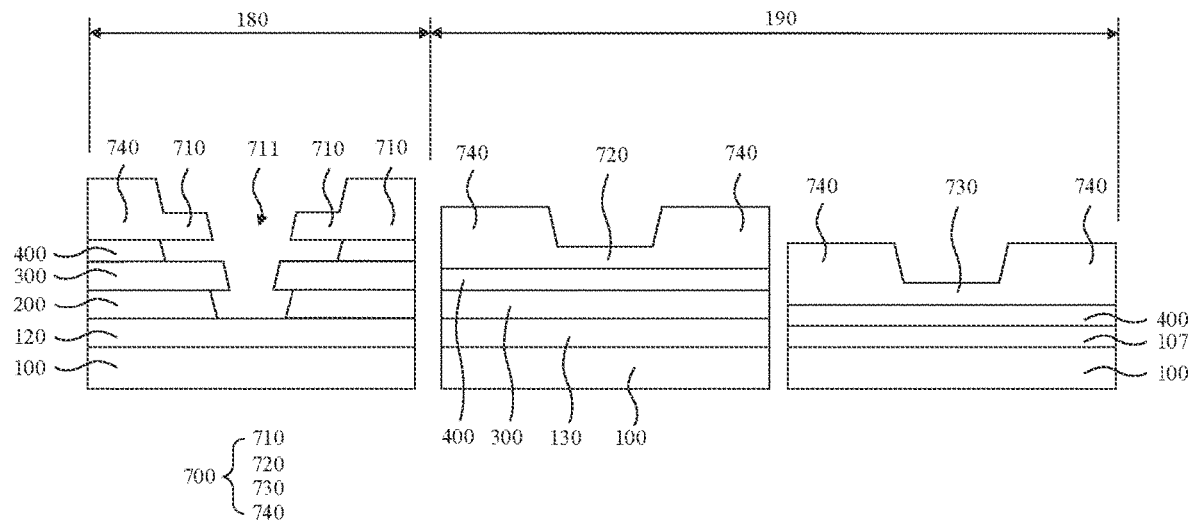

In the step S202, referring to FIG. 8c, in the present disclosure, a dry etching process can be used to perform a first etching process on three insulating layers, since the horizontal etching rate of the second insulating layer 300 is less than the horizontal etching rate of the third insulating layer 400 and the first insulating layer 200, a step may appear between the third insulating layer 400 and the second insulating layer 300 during the first etching process, and an undercut structure is formed between the first insulating layer 200 and the second insulating layer 300.

S30, performing a second patterning process on the photoresist layer 700 to form a second photoresist pattern, and performing a second etching process on the first insulating layer 200, the second insulating layer 300 and the third insulating layer 400 in the first region 180 of the array substrate 10 through the second photoresist pattern to form a first type of via holes 500, and performing a first etching process on the third insulating layer 400 and/or the second insulating layer 300 in the second region 190 of the array substrate 10 to form a second type of via holes 600. The first type of via holes 500 have a hole depth greater than that of the second type of via holes 600, and the first type of via holes 500 have a pore diameter greater than that of the second type of via holes 600.

In this embodiment, the step S30 may comprise:

S301, processing the first photoresist pattern 710, the second photoresist portion 720, and the fourth photoresist portion 740 by an ashing process to remove the first photoresist portion 710, the second photoresist portion 720, and the third photoresist portion 730.

Figure 8D:
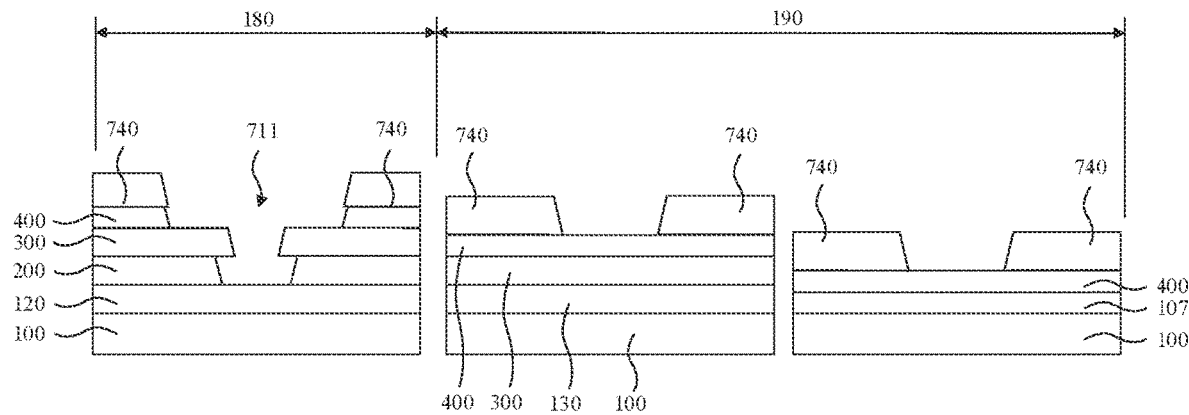

In the step S301, referring to FIG. 8d, in the present disclosure, the first photoresist portion 710, the second photoresist portion 720, and the fourth photoresist portion 740 may be processed by using plasma, so as to remove the first photoresist portion 710, the second photoresist portion 720, and the third photoresist portion 730, and to reduce thickness of the fourth photoresist portion 740.

In this embodiment, plasma in the ashing process may be at least one of nitrogen tetrafluoride, sulfur hexafluoride, oxygen, etc.

After the ashing process is performed on the photoresist, continuing to perform Step S302: performing a second etching process on the first insulating layer 200, the second insulating layer 300 and the third insulating layer 400 corresponding to the first photoresist portion 710 to form a first via hole 510, performing a first etching process on the second insulating layer 300 and the third insulating layer 400 corresponding to the second photoresist portion 720 to form a second via hole 610, and performing a first etching process on the third insulating layer 400 corresponding to the third photoresist portion 730 to form a third via hole 620.

Figure 8E:
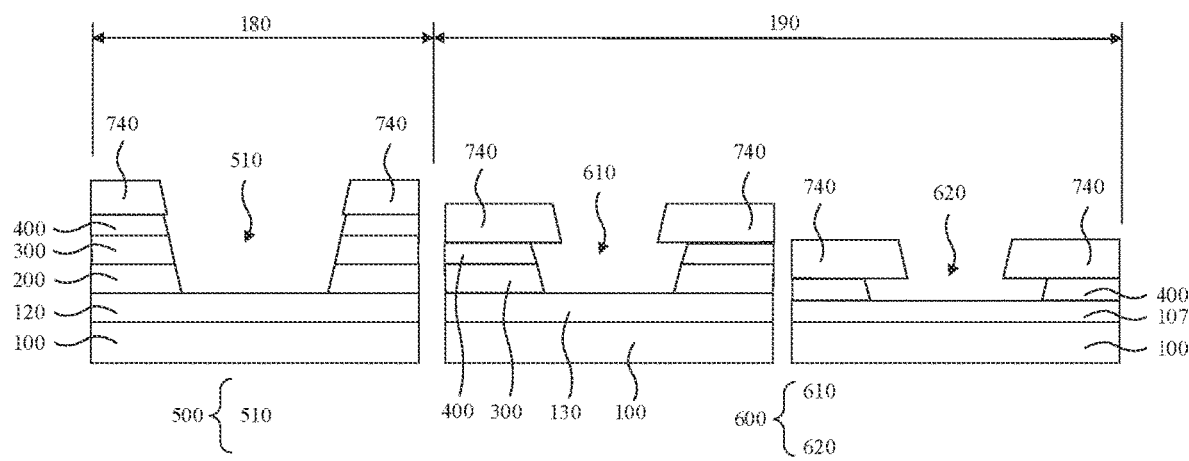

Specifically, in the step S302, referring to FIG. 8e, in the first region 180, the plasma contacts the third insulating layer 400, the second insulating layer 300, and the first insulating layer 200 exposed by the first photoresist portion 710. Since the plasma has a vertical etching rate greater than a horizontal etching rate to the insulating layers, at this time, the first insulating layer 200 and the third insulating layer 400 are in contact with the plasma only in the horizontal direction, and the second insulating layer 300 is in contact with the plasma in both the horizontal direction and the vertical direction, so the plasma has a horizontal etching rate to the second insulating layer 300 greater than that to the first insulating layer 200 and the third insulating layer 400, and the second insulating layer 300 has a back-off rate greater than that of the first insulating layer 200 and the third insulating layer 400, thereby forming the first via hole 510 in FIG. 8e.

In the step S302, referring to FIG. 8e, in the second region 190, the plasma also contacts the third insulating layer 400 and the second insulating layer 300 exposed by the second photoresist portion 720 at the same time. Since the etching rate of the second insulating layer 300 in the horizontal direction is less than that of the third insulating layer 400 in the horizontal direction, the third insulating layer 400 and the second insulating layer 300 exposed by the second photoresist 720 form a step at the beginning of etching stage. As the etching time increases, the plasma has a vertical etching rate greater than a horizontal etching rate to the insulating layers, at this time, the third insulating layer 400 is in contact with the plasma only in the horizontal direction, and the second insulating layer 300 is in contact with the plasma in both the horizontal direction and the vertical direction, so the plasma has a horizontal etching rate to the second insulating layer 300 greater than that to the third insulating layer 400, and the second insulating layer 300 has a back-off rate greater than that of the third insulating layer 400, thereby forming the second via hole 610 in FIG. 8e.

In the step S302, referring to FIG. 8e, in the second region 190, the plasma also contacts the third insulating layer 400 exposed by the third photoresist portion 730, thereby forming the third via hole 620 in FIG. 8e.

In this embodiment, the array substrate 10 may comprise the first metal layer 120, the second metal layer 130, and the common electrode layer 107 disposed on the substrate 100. The first metal layer 120 may be in contact with the first insulating layer 200, the first via hole 510 may correspond to the first metal layer 120, the first via hole 510 exposes a portion of the first metal layer 120 so that upper metal layers can be electrically connected with the first metal layer 120 through the first via hole 510. The second metal layer 130 may be in contact with the second insulating layer 300, the second via hole 610 corresponds to the second metal layer 130, and the second via hole 610 exposes a portion of the second metal layer 130 so that the upper metal layers can be electrically connected with the second metal layer 130 through the second via hole 610. The common electrode layer 107 may be in contact with the third insulating layer 400, the third via hole 620 corresponds to the common electrode layer 107, and the third via hole 620 exposes a portion of the common electrode layer 107 so that the upper metal layers can be electrically connected with the common electrode layer 107 through the third via hole 620.

In this embodiment, structures shown in FIGS. 4 and 6 may also be obtained by the manufacturing method of the present disclosure.

Finally, peeling off the photoresist materials on the third insulating layer 400, and performing subsequent film layer processes.

The present disclosure further provides a display panel 900 comprising the array substrate 10. When the display panel 900 is a liquid crystal display panel, the display panel 900 further comprises a counter substrate disposed opposite to the array substrate 10, and a liquid crystal layer disposed between the array substrate 10 and the counter substrate. When the display panel 900 is an organic light-emitting display panel, the display panel 900 further comprises an organic light-emitting functional layer disposed on the array substrate, and a thin film encapsulation layer disposed on the organic light-emitting functional layer. In addition, the array substrate 10 may also serve as a driving layer in a backlight module.

The present disclosure further provides a mobile terminal comprising a terminal main body and the above display panel, wherein the terminal main body and the display panel are integrated. The terminal body may be a circuit board and other devices bound to the display panel, a cover plate covering the display panel. The mobile terminal may comprise an electronic device such as a mobile phone, a television, or a laptop.

The present disclosure discloses an array substrate, a method of manufacturing an array substrate, and a display panel. The array substrate comprises a laminated substrate, a first insulating layer, a second insulating layer, and a third insulating layer, wherein a horizontal etching rate of the second insulating layer is less than a horizontal etching rate of the first insulating layer and the third insulating layer. The array substrate comprises a first region provided with a first type of via holes and a second region provided with a second type of via holes, the first type of via hole penetrates through the first insulating layer, the second insulating layer, and the third insulating layer, and the second type of via hole penetrates through the third insulating layer. According to the present disclosure, in the first etching process, initially etching is performed on the first type of via holes, and in the second etching process, etching is performed simultaneously on the first type of via holes and the second type of via holes, so that undercut structures formed in the first type of via holes caused by the second insulating layer with a low etching rate are eliminated, meanwhile the second type of via holes are subjected to etching for only one time, thus avoiding the technical problem of over-etching of the second type of via holes.

In the above-mentioned embodiments, descriptions of each embodiment have its own emphasis. For parts that are not detailed in one embodiment, please refer to the related descriptions of other embodiments.

An array substrate, a method for manufacturing an array substrate, and a display panel provided in embodiments of the present disclosure are described in detail above. The principles and embodiments of the present disclosure are described by using specific examples herein. Descriptions of the above embodiments are merely intended to help understand the technical solutions and core ideas of the present disclosure. A person skilled in the art shall understand that it is still possible to modify the technical solutions described in the above embodiments, or equivalently substitute some of the technical features thereof. However, these modifications or substitutions do not make the essence of the corresponding technical solutions depart from scopes of the technical solutions of each embodiment of the present disclosure.

What is claimed is:

1. An array substrate, comprising:
a substrate;
a first insulating layer disposed on the substrate;
a second insulating layer disposed on the first insulating layer, a horizontal etching rate of the first insulating layer being greater than a horizontal etching rate of the second insulating layer; and
a third insulating layer disposed on the second insulating layer, a horizontal etching rate of the third insulating layer being greater than the horizontal etching rate of the second insulating layer;
wherein the array substrate is provided with a first region and a second region, and the array substrate comprises a first type of via holes and a second type of via holes, wherein the first type of via holes are disposed in the first region, the second type of via holes are disposed in the second region, the first type of via holes penetrate through the first insulating layer, the second insulating layer, and the third insulating layer, the second type of via holes penetrate through the third insulating layer, a hole depth of the first type of via holes is greater than that of the second type of via holes, and a pore diameter of the first type of via holes is greater than that of the second type of via holes.

2. The array substrate according to claim 1, wherein the first type of via holes comprise a first via hole penetrating through the first insulating layer, the second insulating layer, and the third insulating layer; and
the second type of via holes comprise a second via hole and a third via hole, wherein the third via hole penetrates through the third insulating layer, and the second via hole penetrates through the second insulating layer and the third insulating layer;
wherein a hole depth of the first via hole is greater than that of the second via hole, a hole depth of the second via hole is greater than that of the third via hole, a pore diameter of the first via hole is greater than that of the third via hole, and a pore diameter of the third via hole is greater than that of the second via hole.

3. The array substrate according to claim 2, wherein the second via hole comprises a first via hole wall disposed on the third insulating layer and a second via hole wall disposed on the second insulating layer, and the first via hole wall and the second via hole wall are continuously disposed; or,
the first via hole wall and the second via hole wall are discontinuously disposed, and a pore diameter of the second via hole on the third insulating layer is larger than that of the second via hole on the second insulating layer.

4. The array substrate according to claim 3, wherein via hole walls of the first via hole on the third insulating layer, the second insulating layer, and the first insulating layer are continuously disposed;
wherein an inclination angle of the via hole walls in the first via hole is smaller than that of the via hole walls in the second via hole.

5. The array substrate according to claim 2, wherein a via hole wall of the first via hole on the second insulating layer and a via hole wall of the first via hole on the first insulating layer are continuously disposed, and a via hole wall of the first via hole on the third insulating layer and the via hole wall of the first via hole on the second insulating layer are discontinuously disposed;
wherein a pore diameter of the first via hole on the third insulating layer is greater than pore diameters of the first via hole on the second insulating layer and the first insulating layer.

6. The array substrate according to claim 2, wherein the array substrate comprises a gate layer disposed on the substrate, a gate insulating layer disposed on the gate layer, a source-drain layer disposed on the gate insulating layer, a first passivation layer disposed on the source-drain layer, a common electrode layer disposed on the first passivation layer, a second passivation layer disposed on the common electrode layer, and a pixel electrode layer disposed on the second passivation layer;
wherein the first via hole penetrates through the second passivation layer, the first passivation layer and the gate insulating layer for electrically connecting the common electrode layer and the gate layer, the second via hole penetrates through the second passivation layer and the first passivation layer for electrically connecting the source-drain layer and the pixel electrode layer, and the third via hole penetrates through the second passivation layer for electrically connecting the common electrode layer and a portion of the pixel electrode layer.

7. The array substrate according to claim 3, wherein the array substrate comprises a gate layer disposed on the substrate, a gate insulating layer disposed on the gate layer, a source-drain layer disposed on the gate insulating layer, a first passivation layer disposed on the source-drain layer, a common electrode layer disposed on the first passivation layer, a second passivation layer disposed on the common electrode layer, and a pixel electrode layer disposed on the second passivation layer;

wherein the first via hole penetrates through the second passivation layer, the first passivation layer, and the gate insulating layer for electrically connecting the common electrode layer and the gate layer, the second via hole penetrates through the second passivation layer and the first passivation layer for electrically connecting the source-drain layer and the pixel electrode layer, and the third via hole penetrates through the second passivation layer for electrically connecting the common electrode layer and a portion of the pixel electrode layer.

8. The array substrate according to claim 4, wherein the array substrate comprises a gate layer disposed on the substrate, a gate insulating layer disposed on the gate layer, a source-drain layer disposed on the gate insulating layer, a first passivation layer disposed on the source-drain layer, a common electrode layer disposed on the first passivation layer, a second passivation layer disposed on the common electrode layer, and a pixel electrode layer disposed on the second passivation layer;

wherein the first via hole penetrates through the second passivation layer, the first passivation layer, and the gate insulating layer for electrically connecting the common electrode layer and the gate layer, the second via hole penetrates through the second passivation layer and the first passivation layer for electrically connecting the source-drain layer and the pixel electrode layer, and the third via hole penetrates through the second passivation layer for electrically connecting the common electrode layer and a portion of the pixel electrode layer.

9. The array substrate according to claim 5, wherein the array substrate comprises a gate layer disposed on the substrate, a gate insulating layer disposed on the gate layer, a source-drain layer disposed on the gate insulating layer, a first passivation layer disposed on the source-drain layer, a common electrode layer disposed on the first passivation layer, a second passivation layer disposed on the common electrode layer, and a pixel electrode layer disposed on the second passivation layer;

wherein the first via hole penetrates through the second passivation layer, the first passivation layer, and the gate insulating layer for electrically connecting the common electrode layer and the gate layer, the second via hole penetrates through the second passivation layer and the first passivation layer for electrically connecting the source-drain layer and the pixel electrode layer, and the third via hole penetrates through the second passivation layer for electrically connecting the common electrode layer and a portion of the pixel electrode layer.

10. The array substrate according to claim 1, wherein a material of the substrate is glass, quartz, or polyimide, or a flexible material.

11. The array substrate according to claim 10, wherein the flexible material is polyimide, or a laminated film layer of a flexible material and an inorganic material.

12. A method for manufacturing an array substrate, comprising steps of:
sequentially forming a first insulating layer, a second insulating layer, a third insulating layer, and a photoresist layer on a substrate, wherein a horizontal etching rate of the first insulating layer is greater than a horizontal etching rate of the second insulating layer, and a horizontal etching rate of the third insulating layer is greater than the horizontal etching rate of the second insulating layer;
performing a first patterning process on the photoresist layer to form a first photoresist pattern, and performing a first etching process on the first insulating layer, the second insulating layer, and the third insulating layer in a first region of the array substrate through the first photoresist pattern;
performing a second patterning process on the first photoresist pattern to form a second photoresist pattern, and performing a second etching process on the first insulating layer, the second insulating layer and the third insulating layer in the first region of the array substrate through the second photoresist pattern to form a first type of via holes, and performing a first etching process on the third insulating layer and/or the second insulating layer in a second region of the array substrate to form a second type of via holes;
wherein a hole depth of the first type of via holes is greater than that of the second type of via holes, and a pore diameter of the first type of via holes is greater than that of the second type of via holes.

13. The method according to claim 12, wherein the step of performing a first patterning process on the photoresist layer to form a first photoresist pattern, and performing a first etching process on the first insulating layer, the second insulating layer, and the third insulating layer in a first region of the array substrate through the first photoresist pattern comprises:
performing a first patterning process on the photoresist layer to form a first photoresist pattern, the first photoresist pattern comprises a first photoresist portion, a second photoresist portion, a third photoresist portion, and a fourth photoresist portion, thicknesses of the first photoresist portion, the second photoresist portion, and the third photoresist portion being the same, the thicknesses of the first photoresist portion, the second photoresist portion, and the third photoresist portion being less than a thickness of the fourth photoresist portion, and the first photoresist portion comprising a first through hole located in the first region; and
performing a first etching process on the first insulating layer, the second insulating layer, and the third insulating layer exposed through the first through hole.

14. The method according to claim 13, wherein the step of performing a second patterning process on the first photoresist pattern to form a second photoresist pattern, and performing a second etching process on the first insulating layer, the second insulating layer and the third insulating layer in the first region of the array substrate through the second photoresist pattern, and performing a first etching process on the third insulating layer in a second region of the array substrate comprises:

processing the first photoresist pattern by an ashing process to remove the first photoresist portion, the second photoresist portion, and the third photoresist portion; and performing a second etching process on the first insulating layer, the second insulating layer and the third insulating layer corresponding to the first photoresist portion to form a first via hole, performing a first etching process on the second insulating layer and the third insulating layer corresponding to the second photoresist portion to form a second via hole, and performing a first etching process on the third insulating layer corresponding to the third photoresist portion to form a third via hole;

wherein a hole depth of the first via hole is greater than that of the second via hole, a hole depth of the second via hole is greater than that of the third via hole, a pore diameter of the first via hole is greater than that of the third via hole, and a pore diameter of the third via hole is greater than that of the second via hole.

15. A display panel comprising an array substrate, wherein the array substrate comprises:

a substrate;

a first insulating layer disposed on the substrate;

a second insulating layer disposed on the first insulating layer, a horizontal etching rate of the first insulating layer being greater than a horizontal etching rate of the second insulating layer; and a third insulating layer disposed on the second insulating layer, a horizontal etching rate of the third insulating layer being greater than the horizontal etching rate of the second insulating layer;

wherein the array substrate is provided with a first region and a second region, and the array substrate comprises a first type of via holes and a second type of via holes, wherein the first type of via holes are disposed in the first region, the second type of via holes are disposed in the second region, the first type of via holes penetrate through the first insulating layer, the second insulating layer, and the third insulating layer, the second type of via holes penetrate through the third insulating layer, a hole depth of the first type of via holes is greater than that of the second type of via holes, and a pore diameter of the first type of via holes is greater than that of the second type of via holes.

16. The display panel according to claim 15, wherein the first type of via holes comprise a first via hole penetrating through the first insulating layer, the second insulating layer, and the third insulating layer; and the second type of via holes comprise a second via hole and a third via hole, wherein the third via hole penetrates through the third insulating layer, and the second via hole penetrates through the second insulating layer and the third insulating layer;

wherein a hole depth of the first via hole is greater than that of the second via hole, a hole depth of the second via hole is greater than that of the third via hole, a pore diameter of the first via hole is greater than that of the third via hole, and a pore diameter of the third via hole is greater than that of the second via hole.

17. The display panel according to claim 16, wherein the second via hole comprises a first via hole wall disposed on the third insulating layer and a second via hole wall disposed on the second insulating layer, and the first via hole wall and the second via hole wall are continuously disposed; or, the first via hole wall and the second via hole wall are discontinuously disposed, and a pore diameter of the second via hole on the third insulating layer is larger than that of the second via hole on the second insulating layer.

18. The display panel according to claim 17, wherein via hole walls of the first via hole on the third insulating layer, the second insulating layer, and the first insulating layer are continuously disposed;

wherein an inclination angle of the via hole walls in the first via hole is smaller than that of the via hole walls in the second via hole.

19. The display panel according to claim 16, wherein a via hole wall of the first via hole on the second insulating layer and a via hole wall of the first via hole on the first insulating layer are continuously disposed, and a via hole wall of the first via hole on the third insulating layer and the via hole wall of the first via hole on the second insulating layer are discontinuously disposed;

wherein a pore diameter of the first via hole on the third insulating layer is greater than pore diameters of the first via hole on the second insulating layer and the first insulating layer.

20. The display panel according to claim 16, wherein the array substrate comprises a gate layer disposed on the substrate, a gate insulating layer disposed on the gate layer, a source-drain layer disposed on the gate insulating layer, a first passivation layer disposed on the source-drain layer, a common electrode layer disposed on the first passivation layer, a second passivation layer disposed on the common electrode layer, and a pixel electrode layer disposed on the second passivation layer;

wherein the first via hole penetrates through the second passivation layer, the first passivation layer and the gate insulating layer for electrically connecting the common electrode layer and the gate layer, the second via hole penetrates through the second passivation layer and the first passivation layer for electrically connecting the source-drain layer and the pixel electrode layer, and the third via hole penetrates through the second passivation layer for electrically connecting the common electrode layer and a portion of the pixel electrode layer.

* * * * *